(12) United States Patent
Lin et al.

(10) Patent No.: US 11,728,199 B2
(45) Date of Patent: Aug. 15, 2023

(54) SUBSTRATE SUPPORT FEATURES AND METHOD OF APPLICATION

(71) Applicant: ASMPT NEXX, INC., Billerica, MA (US)

(72) Inventors: I-Kuan Lin, Lexington, MA (US); Arthur Sommerstein, Marblehead, MA (US); Khanh Vo, Braintree, MA (US); Kevin Barbera, Haverhill, MA (US)

(73) Assignee: ASMPT NEXX, INC., Billerica, MA (US)

( * ) Notice: Subject to any disclaimer, the term of this patent is extended or adjusted under 35 U.S.C. 154(b) by 801 days.

(21) Appl. No.: 16/724,614

(22) Filed: Dec. 23, 2019

(65) Prior Publication Data

US 2021/0193496 A1  Jun. 24, 2021

(51) Int. Cl.
| | | |
|---|---|---|
| *H01L 21/683* | (2006.01) | |
| *H01L 21/687* | (2006.01) | |
| *B32B 7/12* | (2006.01) | |
| *B32B 27/12* | (2006.01) | |
| *B32B 27/08* | (2006.01) | |
| *B32B 27/28* | (2006.01) | |
| *B32B 5/02* | (2006.01) | |
| *B32B 37/12* | (2006.01) | |
| *B32B 3/08* | (2006.01) | |
| *B32B 37/00* | (2006.01) | |
| *B32B 38/18* | (2006.01) | |
| *B32B 7/06* | (2019.01) | |

(Continued)

(52) U.S. Cl.
CPC .......... *H01L 21/6835* (2013.01); *B32B 3/085* (2013.01); *B32B 3/266* (2013.01); *B32B 5/02* (2013.01); *B32B 7/06* (2013.01); *B32B 7/12* (2013.01); *B32B 7/14* (2013.01); *B32B 27/08* (2013.01); *B32B 27/12* (2013.01); *B32B 27/281* (2013.01); *B32B 37/025* (2013.01); *B32B 37/06* (2013.01); *B32B 37/08* (2013.01); *B32B 37/12* (2013.01); *B32B 38/10* (2013.01); *B32B 38/1833* (2013.01); *H01L 21/68742* (2013.01); *B32B 2309/02* (2013.01); *B32B 2309/12* (2013.01); *B32B 2371/00* (2013.01); *B32B 2377/00* (2013.01); *B32B 2457/14* (2013.01)

(58) Field of Classification Search
CPC . H01L 21/6835; H01L 21/68742; B32B 7/12; B32B 7/06; B32B 7/14; B32B 3/086; B32B 3/266; B32B 27/12; B32B 27/08; B32B 27/026; B32B 27/06; B32B 5/02
USPC ....................................... 428/40.1
See application file for complete search history.

(56) References Cited

U.S. PATENT DOCUMENTS

| | | | |
|---|---|---|---|
| 9,287,156 B2 * | 3/2016 | Moriya | H01L 21/6833 |
| 10,347,520 B2 * | 7/2019 | Kim | B05D 1/02 |

(Continued)

FOREIGN PATENT DOCUMENTS

| | | | | |
|---|---|---|---|---|
| CN | 107221510 A | * | 9/2017 | H01L 21/6836 |

*Primary Examiner* — Michael M. Bernshteyn
(74) *Attorney, Agent, or Firm* — Ostrolenk Faber LLP

(57) ABSTRACT

A method for applying raised features to a semiconductor substrate chuck, each feature acting to space a substrate from the chuck in use, the method comprising the steps of:
i) providing an assembly having a carrier layer, a feature adhered to the carrier layer, and a peel-ply layer adhered to the carrier layer such that the feature is enclosed between the carrier layer and the peel-ply layer,
ii) removing the peel-ply layer, and
iii) adhering the feature to the chuck.

18 Claims, 7 Drawing Sheets

(51) Int. Cl.
*B32B 37/08* (2006.01)
*B32B 38/10* (2006.01)
*B32B 7/14* (2006.01)
*B32B 37/06* (2006.01)
*B32B 3/26* (2006.01)

(56) References Cited

U.S. PATENT DOCUMENTS

| | | | |
|---|---|---|---|
| 11,222,864 B2* | 1/2022 | Chung | H01L 21/6835 |
| 2014/0204501 A1* | 7/2014 | Moriya | H01L 21/6833 |
| | | | 361/234 |
| 2016/0233121 A1* | 8/2016 | Kim | B05D 3/0493 |
| 2020/0243481 A1* | 7/2020 | Chung | H01L 21/67132 |

* cited by examiner

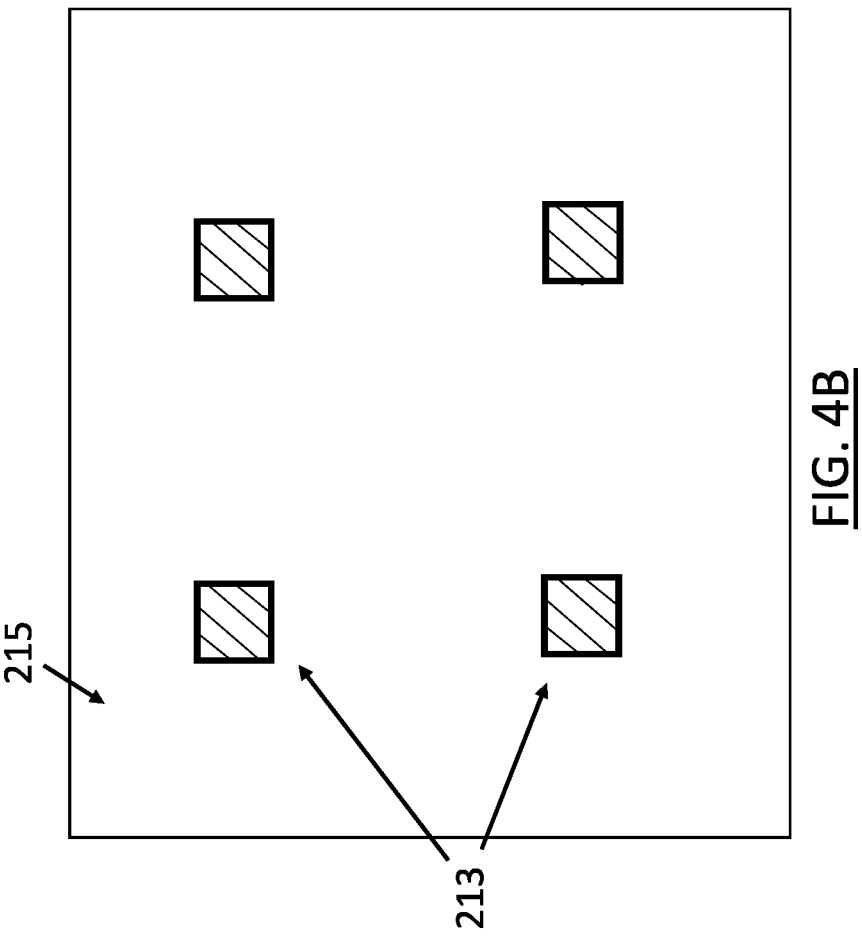
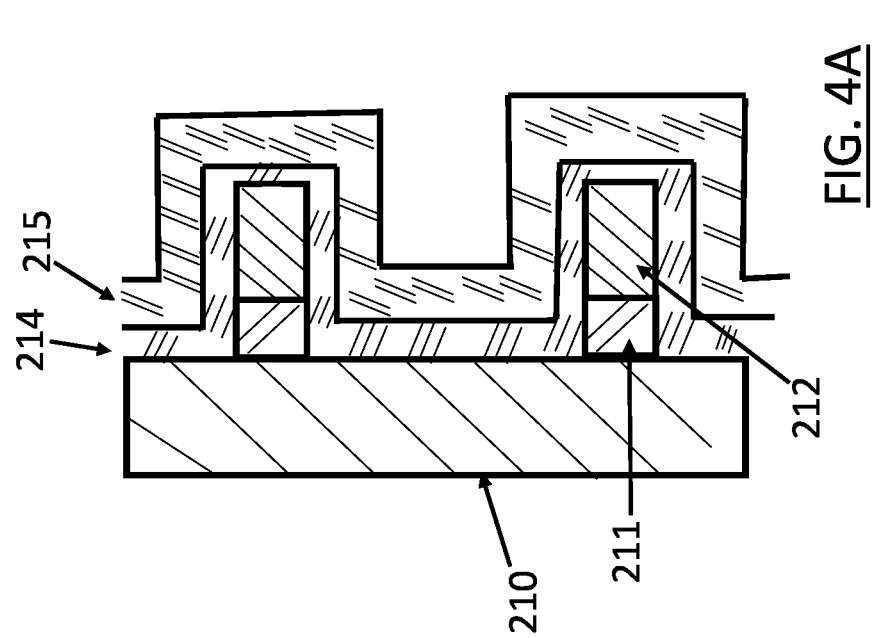
FIG. 4A
FIG. 4B

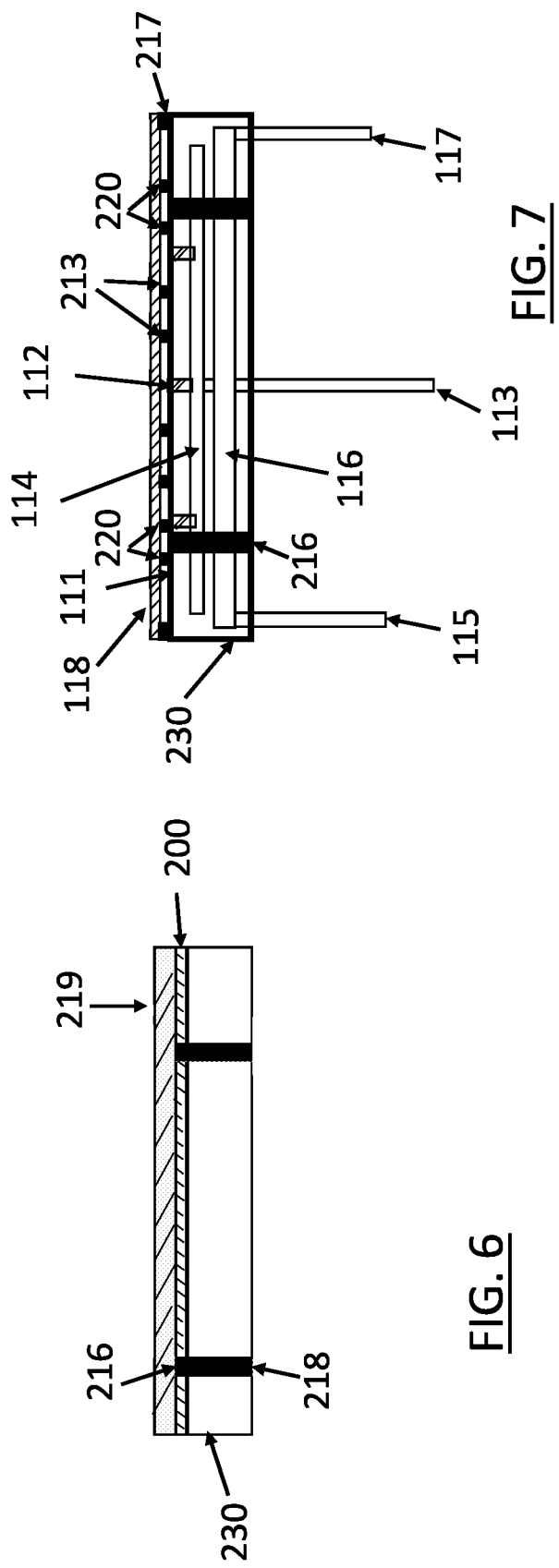

SUBSTRATE SUPPORT FEATURES AND METHOD OF APPLICATION

This invention relates to an assembly for applying raised features to a semiconductor substrate chuck, a method for applying a pattern of raised substrate support features onto a chuck surface, and a method for making such an assembly.

BACKGROUND OF THE INVENTION

This invention is in the field of semiconductor processing in which substrates are supported by chucks. These chucks may clamp the supported substrates during material processing using electrostatic chucking (ESC) or by vacuum clamping. The supported substrates may for example be semiconductor wafers, redistributed wafers, or panels containing die embedded in polymer material, or other substrates containing electronic circuits. The material processing applications for the invention may include vacuum or sub-atmospheric processes such as physical vapor deposition (PVD), chemical vapor deposition (CVD), ion implantation, and material removal by either reactive ion etch or physical sputtering etch. Material processing applications may also include atmospheric processing such as thermal annealing or other thermal processing, chemical mechanical polishing, etc.

Semiconductor substrates typically require cooling or heating during processing. This is often accomplished by providing gas to the backside of the substrate. The uniformity of heating or cooling of the substrate is an important parameter which affects processing uniformity. Thermal uniformity of substrates for chucks with backside gas provision rely on the uniformity of the gas pressure between the chuck and the substrate.

An example prior art chuck 100, with a chuck face 111 on which a substrate 118 may be mounted, is shown in FIGS. 1A and 1B. The chuck has a cooled body 110 containing a cooling-fluid manifold 116 with fluid inlet 115 and fluid outlet 117. Gas is provided to gas manifold 114 via a gas inlet 113, and distributed to holes 112 to provide gas to the area between the chuck face 111 and the substrate 118. Uniform gas distribution is accomplished using radial and azimuthal channels 119 machined into the chuck face 111.

An alternative prior art chuck 101 is shown in FIGS. 2A and 2B, in which reference numerals for like components are retained where appropriate. Gas is provided to gas manifold 114 by gas inlet 113, and distributed to one or more holes 112. A pattern of raised embossment features 120 on chuck face 111, which project toward the substrate 118, allows gas to uniformly distribute in the region on the backside of the substrate 118, i.e. the side of the substrate closest to the chuck face 111. The chuck face 111 may be machined (for example by milling or blasting through a mask) to provide the raised embossment features 120. Alternatively, the features 120 may be deposited on the chuck face 111 by physical vapor deposition (PVD) or by chemical vapor deposition (CVD). Alternatively, a thin capping layer of ceramic or metal containing the raised embossment features may be adhesively bonded to the chuck face 111. The chuck face 111 may clamp the substrate 118 thereon using electrostatic or vacuum chucking. In such prior art chucks, the embossment becomes permanently integrated into the chuck face 111.

Semiconductor chuck surfaces require periodic maintenance. The chuck surface may need to be cleaned of metal, polymer or other process-related contamination. Chuck embossment features 120 may become damaged during cleaning. The features may also be abraded by repeated contact with wafers or other substrates during processing. There is therefore a need to periodically replace raised embossment features on semiconductor chucks.

Maintenance of semiconductor chucks is often done at or near wafer fabrication facilities for reasons of cost and convenience. There is a need for the replacement of embossment features to be done in the field using low-cost materials, tooling and equipment.

It is an aim of the present invention to provide an assembly which allows chuck embossment features to be easily replaced without requiring expensive factory refurbishment. It is a further aim of the present invention to provide a method to apply the assembly to a chuck surface, depositing and bonding a pattern of support features to the surface.

In accordance with the present invention these aims are achieved by forming features and adhering these to a peel-ply layer, i.e. a layer which provides protection and reduces contamination when applied, but can be removed through peeling, which may subsequently be removed to retain the features on a chuck.

SUMMARY OF THE INVENTION

In accordance with a first aspect of the present invention there is provided an assembly for applying raised features to a semiconductor substrate chuck, each feature acting to space a substrate from the chuck in use, the assembly comprising:

a carrier layer having first and second major sides, at least one feature adhered to the first side of the carrier layer, and a peel-ply layer adhered to the first side of the carrier layer such that the at least one feature is enclosed between the carrier layer and the peel-ply layer, wherein the feature may be applied to a chuck by removal of the peel-ply layer and subsequently adhering the feature to the chuck.

In accordance with a second aspect of the present invention there is provided a method for applying raised features to a semiconductor substrate chuck, each feature acting to space a substrate from the chuck in use, the method comprising the steps of:

i) providing the assembly of the first aspect,
ii) removing the peel-ply layer, and
iii) adhering the feature to the chuck.

In accordance with a third aspect of the present invention there is provided a method of making the assembly of the first aspect, comprising the steps of:

bonding together a peel-ply layer, an adhesive layer and a polymeric embossment layer to form a multi-layer structure, removing portions of the embossment layer and adhesive layer to create at least one feature bonded to the peel-ply layer, and adhering a carrier layer onto the peel-ply layer to enclose the at least one feature therebetween.

Other specific aspects and features of the present invention are set out in the accompanying claims.

BRIEF DESCRIPTION OF THE DRAWINGS

The invention will now be described with reference to the accompanying drawings (not to scale), in which:

FIGS. 4A and 4B are schematic section and plan views of a portion of the assembly for depositing support features on a chuck at an intermediate fabrication step;

FIG. 6 is a schematic section view of a chuck, an applicator assembly for depositing support features on the chuck and fabrication tooling; and FIG. 7 is a schematic section view of a chuck with deposited features supporting a substrate.

DETAILED DESCRIPTION OF THE PREFERRED EMBODIMENTS OF THE INVENTION

Figure 3B:
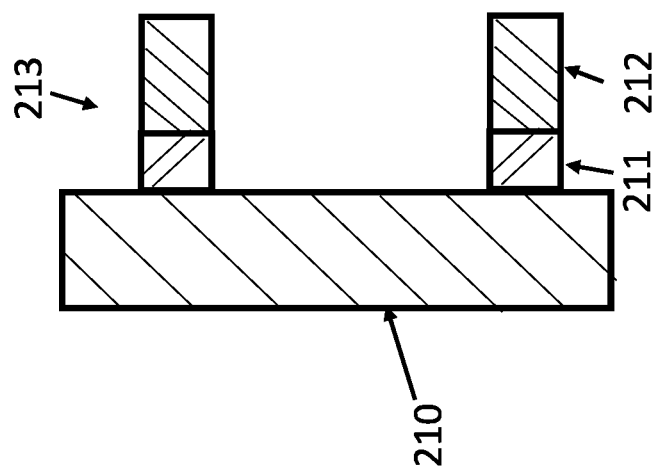
FIGS. 3A to 3D are schematic section views of an assembly for depositing support features on a chuck, shown at initial and intermediate fabrication steps, in accordance with an embodiment of the present invention.
Figure 3A:
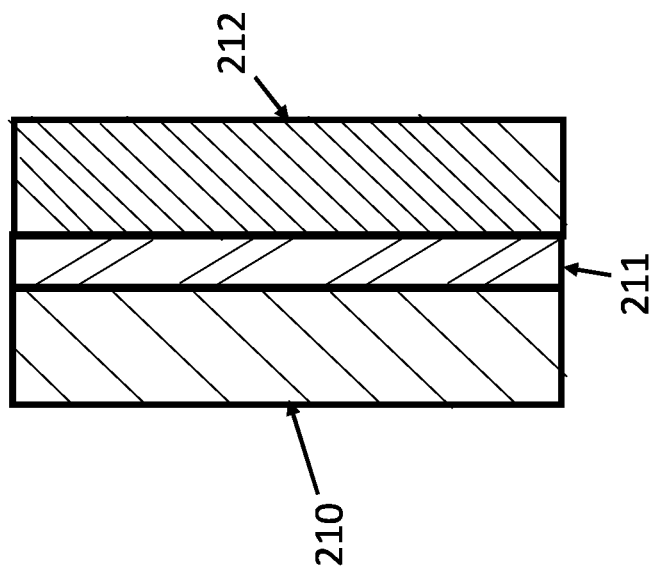

FIG. 3A schematically shows in section an initial structure for depositing support features on a chuck at an initial fabrication step. Three bonded layers are shown at this fabrication step, namely embossment layer 212, which is bonded to a smooth-surfaced peel-ply supportive polymer layer 210 (hereafter "peel-ply layer 210") by an adhesive layer 211, here a pressure sensitive adhesive layer.

The embossment layer 212 may consist of polymer material such as polyetheretherketone (PEEK) or polyimide for example, with a thickness in the range from 5-100 µm, and preferably between 10-30 µm. The peel-ply layer 210 may comprise a woven fabric, nylon or other synthetic polymer material. The thickness of peel-ply layer 210 may be in the range 0.1-1.0 mm. The adhesive layer 211 may be constituted as an adhesive pad material which may be fabricated from a variety of polymers including acrylic acid esters, polyurethanes and silicones for example, and should have a bond strength greater than 10 lb/inch (1750 N/m) and flow at a temperature above 150° C.

FIG. 3B schematically shows, in an expanded sectional view, the assembly at a second fabrication step, following laser cutting of the embossment layer 212 and adhesive layer 211 to remove portions thereof so as to leave a plurality of small supporting features 213. These supporting features 213 may for example be of rectangular, circular or of other shapes when viewed from above (i.e. towards the peel-ply layer 210). The supporting features 213 may have width and length (dimensions parallel to the peel-ply layer 210) or diameters of between 0.25-3 mm.

Figure 1B:
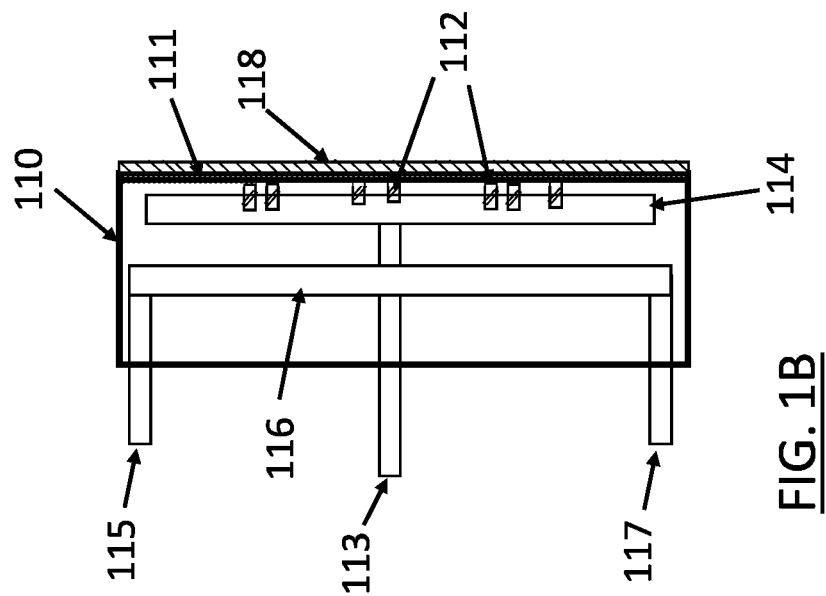
FIGS. 1A and 1B respectively show schematic plan and section views of a prior art chuck with backside gas distributed by channels.
Figure 1A:
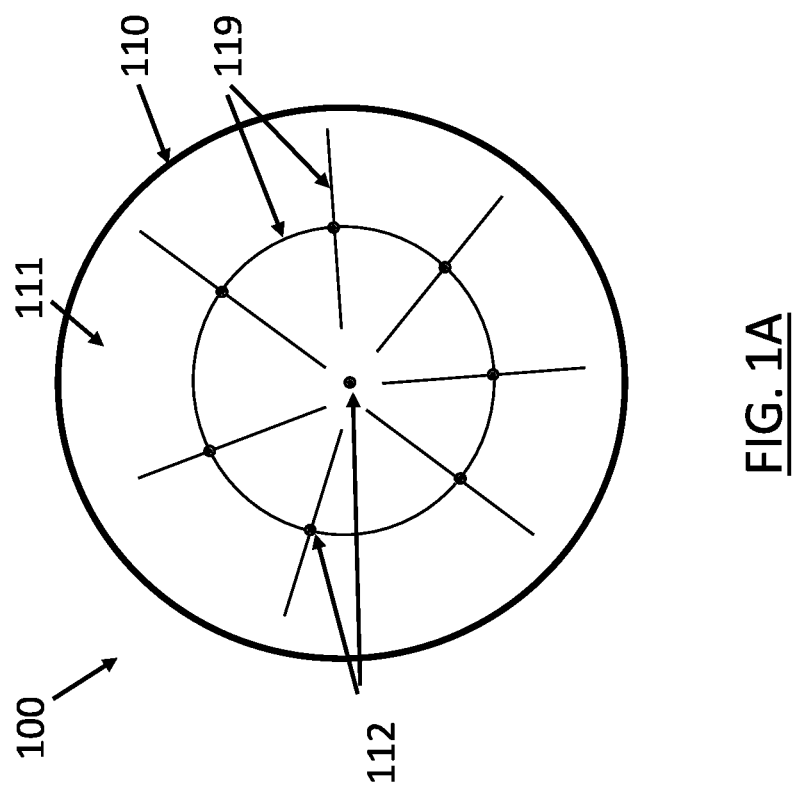
Figure 2B:
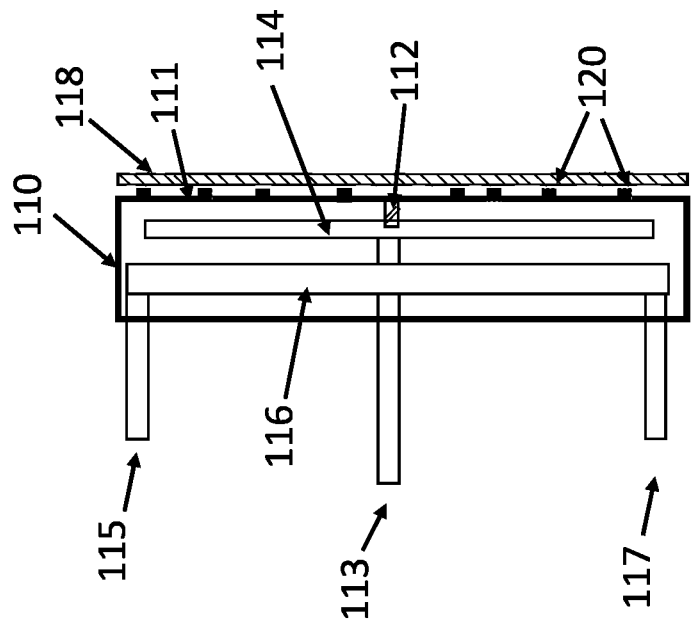
FIGS. 2A and 2B respectively show schematic plan and section views of a prior art chuck with backside gas distributed by integrated embossment features.
Figure 2A:
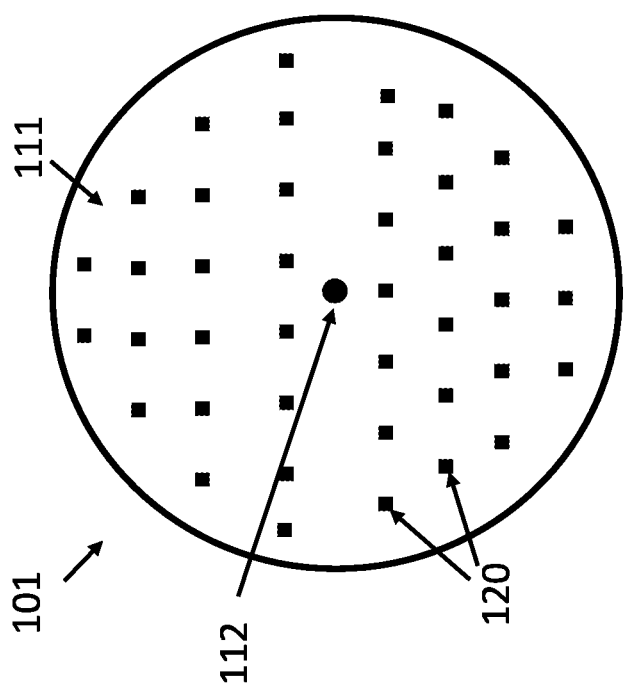
Figure 3D:
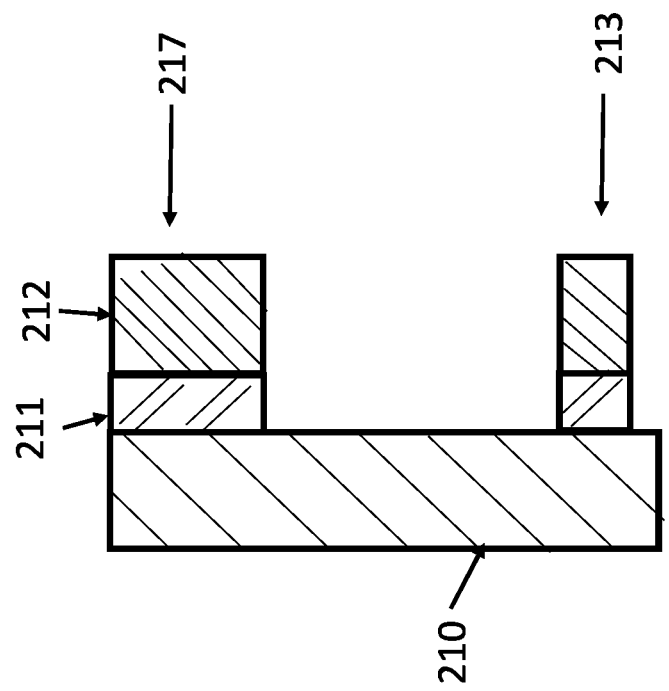
Figure 3C:
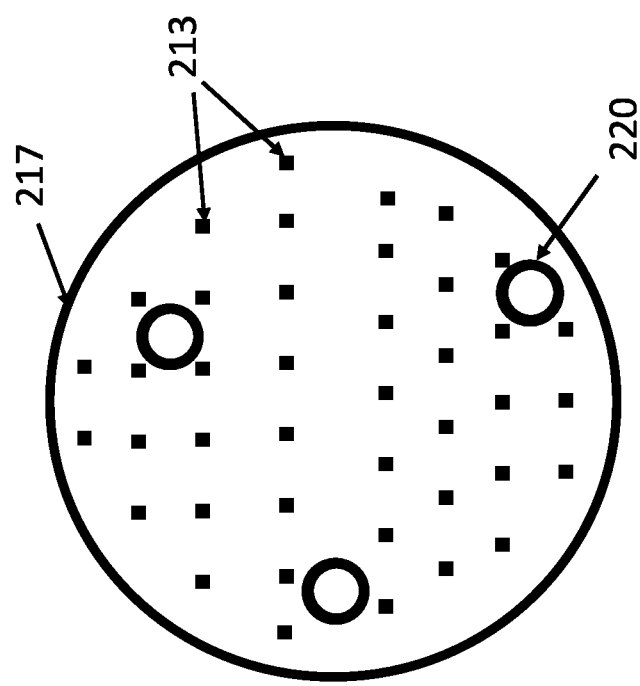

FIGS. 3C and 3D schematically show, in plan and expanded sectional views respectively, additional details of the assembly for the second fabrication step. The laser cutting of embossment layer 212 and adhesive layer 211 is controlled to form a feature in the form of a raised-edge rim 217 around the perimeter of peel-ply layer 210. This raised-edge rim 217 defines a continuous border surrounding all other features, such as supporting features 213, when applied to a chuck. In addition, the laser cutting is controlled to form other features in the form of a plurality of raised rings 220, each of which defines a closed shape surrounding no other features when applied to a chuck. Both the raised-edge rim 217 and raised rings 220 project outwardly from peel-ply layer 210. The raised-edge rim 217 and raised rings 220 may have width in the range of 0.5-5.0 mm, and may preferably be less than 3 mm. For round substrates, the outer diameter of raised-edge rim 217 should match the diameter of substrate 118. For substrates of other shapes, the outer edge of raised-edge rim 217 should be coincident with the edge of substrate 118. The raised rings 220 are used to isolate holes (such as 112, see FIGS. 1, 2) on chucks to prevent gas leakage.

FIGS. 4A and 4B schematically show, in expanded sectional and expanded plan view respectively, an assembly for depositing supporting features 213 onto a chuck in a third fabrication step. A carrier layer 215, with an adhesive backing 214 adhered directly onto the lower surface of the carrier layer 215, is aligned and placed onto the upper surface of the assembly shown in FIG. 3. The peel-ply layer 210 and carrier layer 215 are pressed together with sufficient pressure to securely enclose and adhere the supporting features 213 to the carrier layer 215. The carrier layer 215 is made from a polymer, which may for example comprise a woven fabric, nylon or other synthetic material. The carrier layer 215 thickness may be between 0.1-1.0 mm.

Figure 5B:
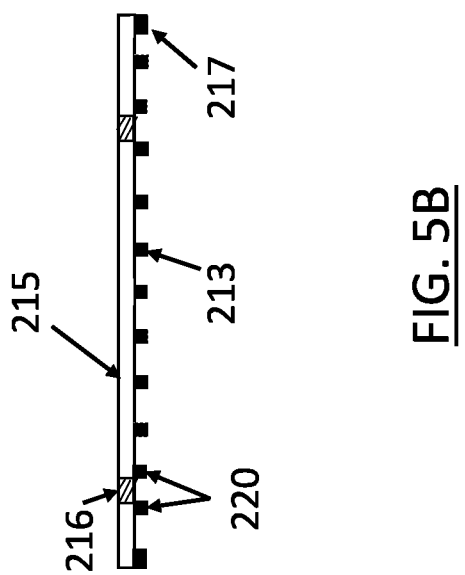
FIGS. 5A and 5B schematically show, in plan and section views respectively, an assembly for depositing features onto a chuck following fabrication.
Figure 5A:
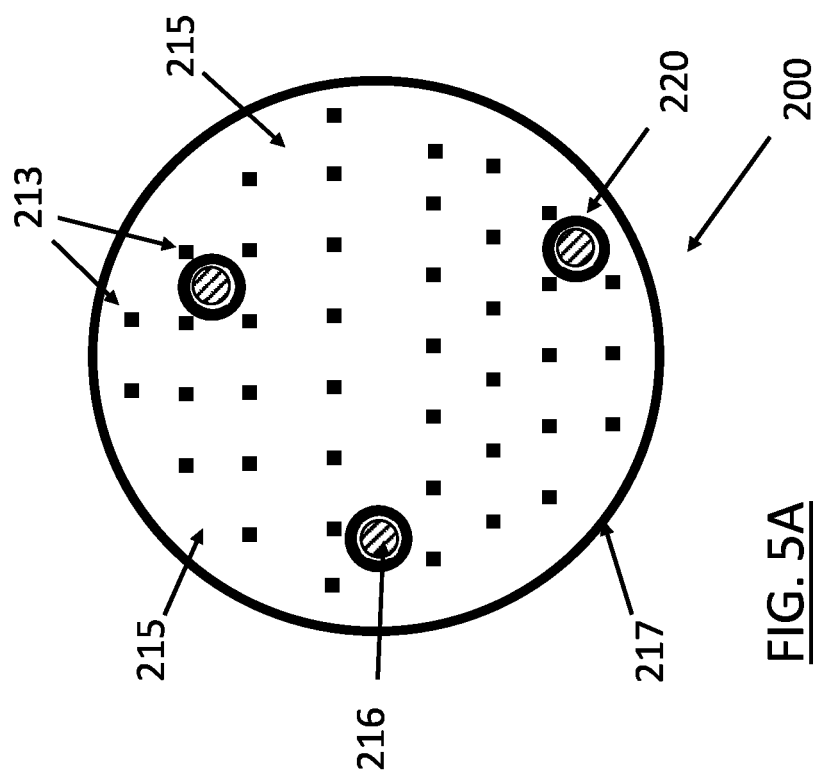

FIGS. 5A and 5B schematically show, in plan and section views respectively, an applicator assembly 200 for depositing features onto a chuck at the completion of its fabrication, after the final fabrication step in which plurality of alignment holes 216 have been laser cut in the carrier layer 215. The peel-ply layer 210 has been manually removed, for example by insertion of a small tool between the peel-ply and carrier layers. The smooth surface of the peel-ply layer 210 facilitates its removal. In addition, the adhesive backing layer 214 and adhesive layer 211 are chosen so that at room temperature, the adhesion between the carrier layer 215 and the embossment layer 212 exceeds the adhesion between the peel-ply layer 210 and the embossment layer 212. It should be noted that in FIG. 5B the carrier layer 215 is shown as being smooth, unlike the view in FIG. 4A. This difference is simply due to the difference in scale between the two figures.

FIG. 6 schematically shows, in sectional view, a chuck 230, the assembly 200 for depositing raised features on the chuck 230, and alignment pins 218 which have been inserted into and interface with the alignment holes 216 in the assembly 200 for properly positioning the assembly with respect to the chuck 230. Chuck 230 has previously been cleaned of any raised features, for example as previously adhered using a similar assembly. Heated tooling 219 is used to press the assembly 200 against the chuck 230 to activate the adhesive layer 211, bonding the raised supporting features 213, the raised rings 220 and the raised-edge rim 217 to chuck 230. Practitioners skilled in the art will understand that other methods can be used for applying pressure and heat in order to adhesively bond the assembly 200 to the chuck 230. The chuck is then cooled, and after cooling the carrier layer 215 can be removed by mechanical peeling, leaving raised features 213 bonded to the chuck 230.

FIG. 7 schematically shows, in sectional view, the chuck 230 after processing with the assembly 200, and ready for use in a semiconductor process. Components 113, 115, 116, 117 are all as previously described with reference to FIGS. 1 and 2. The raised supporting features 213, raised rings 220 and raised-edge rim 217 are shown in contact with the substrate 118. Gas supplied through the holes 112 is uniformly distributed between a chuck face 231 and the backside of substrate 118. The backside gas pressure is maintained through the seal with the substrate 118 provided by the raised-edge rim 217.

The above-described embodiment is exemplary only, and other possibilities and alternatives within the scope of the invention will be apparent to those skilled in the art.

REFERENCE NUMERALS USED 100, 101, 230—Chuck
110—Cooled body
111—Chuck face
112—Holes
113—Gas inlet
114—Gas manifold
115—Fluid inlet
116—Cooling-fluid manifold
117—Fluid outlet
118—Substrate
119—Channels
120—Embossment features
200—Assembly
210—Peel-ply supportive polymer layer
211—Adhesive layer
212—Embossment layer
213—Supporting features
214—Adhesive backing
215—Carrier layer
216—Alignment holes
217—Raised-edge rim
218—Alignment pins
219—Heated tooling
220—Raised rings

The invention claimed is:

1. An assembly for applying at least one feature to a semiconductor substrate chuck, the at least one feature being raised from the semiconductor substrate chuck to space a substrate from the chuck in use, the assembly comprising:
   a carrier layer having first and second major sides,
   a feature adhered to the first side of the carrier layer, and
   a peel-ply layer adhered to the first side of the carrier layer to enclose the feature between the carrier layer and the peel-ply layer,
   wherein the peel-ply layer is removable from the first side of the carrier layer,
   wherein upon removal of the peel-ply layer the feature remains supported by the carrier layer,
   wherein the feature is applied to a chuck by removal of the peel-ply layer and subsequently adhering the feature to the chuck.

2. The assembly of claim 1, comprising a layer of adhesive located between the feature and the peel-ply layer, for adhering the feature to the chuck.

3. The assembly of claim 2, wherein the layer of adhesive comprises a polymer, wherein the polymer is selected from the group consisting of acrylic acid esters, polyurethanes, and silicones.

4. The assembly of claim 1, further comprising an adhesive backing adhered directly to the first side of the carrier layer.

5. The assembly of claim 1, wherein the feature comprises a rim which defines a continuous border surrounding additional features when applied to a chuck.

6. The assembly of claim 1, wherein the feature comprises a ring which defines a closed shape surrounding no other feature when applied to a chuck.

7. The assembly of claim 6, further comprising a hole in the carrier layer proximate the ring, to align the assembly with a chuck in use.

8. The assembly of claim 7, further comprising an alignment pin passing through the hole, for engagement with a chuck in use.

9. The assembly of claim 1, wherein the peel-ply layer comprises woven fabric or synthetic polymer material.

10. The assembly of claim 1, wherein the feature comprises a polymer material.

11. A method of using the assembly of claim 1 for applying raised features to a semiconductor substrate chuck, each feature acting to space a substrate from the chuck in use, the method comprising the steps of:
   i) providing the assembly of claim 1,
   ii) removing the peel-ply layer, and
   iii) adhering the feature to the chuck.

12. The method of claim 11, wherein step iii) comprises aligning the assembly with the chuck before adhering the feature to the chuck.

13. The method of claim 11, wherein at least two alignment pins are inserted through the assembly and into the chuck to align the assembly with the chuck.

14. The method of claim 11, wherein in step iii), adhering the feature to the chuck comprises applying heat and pressure to the chuck and assembly.

15. The method of claim 11, comprising the additional step of:
   iv) cooling the chuck after step iii).

16. The method of claim 11, comprising a final step of removing the carrier layer from the assembly.

17. A method of making the assembly of claim 1, comprising the steps of:
   bonding together a peel-ply layer, an adhesive layer and a polymeric embossment layer to form a multi-layer structure,
   removing portions of the embossment layer and adhesive layer to create at least one feature bonded to the peel-ply layer, and
   adhering a carrier layer onto the peel-ply layer to enclose the at least one feature therebetween.

18. The assembly of claim 10, wherein the polymer material comprises polyetheretherketone or polyimide.

* * * * *